US007952417B2

(12) United States Patent
Burdett (10) Patent No.: US 7,952,417 B2
(45) Date of Patent: May 31, 2011

(54) POWER CONTROL CIRCUIT (75) Inventor: Alison Burdett, Oxfordshire (GB)

(73) Assignee: Future Waves UK Limited, London (GB)

( * ) Notice: Subject to any disclaimer, the term of this patent is extended or adjusted under 35 U.S.C. 154(b) by 0 days.

(21) Appl. No.: 12/861,465

(22) Filed: Aug. 23, 2010

(65) Prior Publication Data

US 2010/0315151 A1 Dec. 16, 2010

Related U.S. Application Data

(63) Continuation of application No. 12/161,541, filed as application No. PCT/GB2007/050017 on Jan. 15, 2007.

(60) Provisional application No. 60/761,363, filed on Jan. 24, 2006.

(30) Foreign Application Priority Data

Mar. 6, 2006 (GB) .................................. 0604386.3

(51) Int. Cl.
*G06F 1/26* (2006.01)
*G11C 5/14* (2006.01)
*H03K 17/00* (2006.01)

(52) U.S. Cl. ....................................... 327/365; 713/300

(58) Field of Classification Search .................. 327/365; 713/300
See application file for complete search history.

(56) References Cited

U.S. PATENT DOCUMENTS

| 5,767,844 | A | * | 6/1998 | Stoye | 345/212 |
| 6,586,974 | B1 | * | 7/2003 | Humphrey et al. | 327/108 |
| 2003/0056127 | A1 | * | 3/2003 | Vaglica | 713/300 |
| 2005/0135174 | A1 | * | 6/2005 | Lee et al. | 365/226 |

FOREIGN PATENT DOCUMENTS

EP 1256870 11/2002
(Continued)

OTHER PUBLICATIONS

International Search Report for corresponding International Application No. PCT/GB2007/050017 dated Aug. 8, 2007.
(Continued)

*Primary Examiner* — Lincoln Donovan
*Assistant Examiner* — Ryan C Jager
(74) *Attorney, Agent, or Firm* — Caesar, Rivise, Bernstein, Cohen & Pokotilow, Ltd.

(57) ABSTRACT

Apparatus for controlling an integrated circuit comprises a power control device for controlling the power to at least part of the integrated circuit, the power control device is connected to a first input, for receiving a power-down signal, and a second input, for receiving a power-up signal, the power control device is adapted to power-up the at least part of the integrated circuit if a power-up signal is received at the second input when the at least part of the integrated circuit is in a powered-down state, and the power control device is further adapted to maintain the at least part of the integrated circuit in the powered-up state regardless of any signal received at the second input when the at least part of the integrated circuit is in a powered-up state, the apparatus is arranged so that the second input is also connected to a component of the integrated circuit and the apparatus comprising means for sending a signal to the component of the integrated circuit via the second input when the at least part of the integrated circuit is in the powered-up state.

8 Claims, 5 Drawing Sheets

FOREIGN PATENT DOCUMENTS

| | | |
|---|---|---|
| EP | 1441278 | 7/2004 |
| EP | 1491988 | 12/2004 |
| GB | 2375856 | 11/2002 |
| GB | 2401961 | 11/2004 |

OTHER PUBLICATIONS

Search Report for corresponding Application No. GB 0604386.3 dated Jun. 19, 2006.

* cited by examiner

POWER CONTROL CIRCUIT

CROSS-REFERENCE TO RELATED APPLICATIONS

This continuation application claims the benefit under 35 U.S.C. §120 of U.S. application Ser. No. 12/161,541 filed on Jul. 18, 2008 which, in turn, is a national stage application that claims the benefit under 35 U.S.C. §371 of International Application No. PCT/GB2007/050017 filed on Jan. 15, 2007, which in turn takes its priority from U.S. Provisional Application No. 60/761,363 filed on Jan. 24, 2006 and also takes its priority from GB Application No. 0604386.3 filed on Mar. 6, 2006, and all of whose entire disclosures are incorporated by reference herein.

This continuation application claims the benefit under 35 U.S.C. §120 of U.S. application Ser. No. 12/161,541 filed on Jul. 18, 2008 which, in turn, is a national stage application that claims the benefit under 35 U.S.C. §371 of International Application No. PCT/GB2007/050017 filed on Jan. 15, 2007, which in turn takes its priority from U.S. Provisional Application No. 60/761,363 filed on Jan. 24, 2006 and also takes its priority from GB Application No. 0604386.3 filed on Mar. 6, 2006, and all of whose entire disclosures are incorporated by reference herein.

FIELD OF THE INVENTION

The present invention generally relates to a power control circuit for use in an integrated circuit (IC) chip.

BACKGROUND OF THE INVENTION

Figure 1:
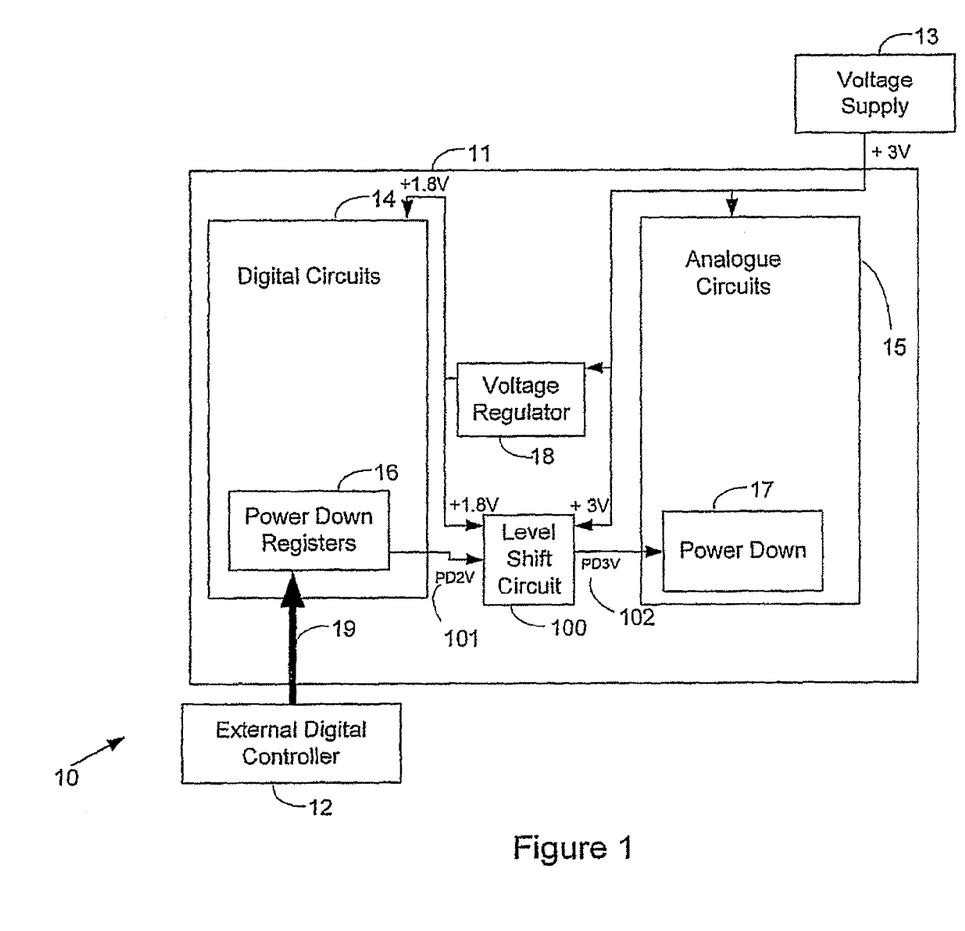
FIG. 1 shows a mixed signal chip.

Referring to FIG. 1, a mixed-signal IC chip 11 combines both analogue 15 and digital 14 circuits on a single semiconductor die. Mixed-signal ICs 11 may operate from a single voltage supply 13 (herein referred to as RFVDD) typically of 3 volts (V), with analogue circuits 15 generally powered directly from this voltage. However, a lower supply voltage is also required to power the digital circuits 14 on the chip 11. Thus, an on-chip voltage regulator 18 is often included to generate for example 1.8V (or DIGVDD) from the 3V voltage supply 13 in order to supply lower voltage to the digital circuits 14.

One purpose of the digital circuitry 14 is to control the state of the various analogue circuits 15 on the chip 11 by storing "power down" control bits in digital registers (also referred to as power down register 16). The power down control bits may operate in a "NOT" logic convention. In that case, if the power down bit for a power down circuit 17 in the analogue circuit is set to 0V or logic "LOW", the circuit will be active and is not powered down; and if the power down bit is set to DIGVDD or logic "HIGH", the circuit will be powered down.

Figure 2:
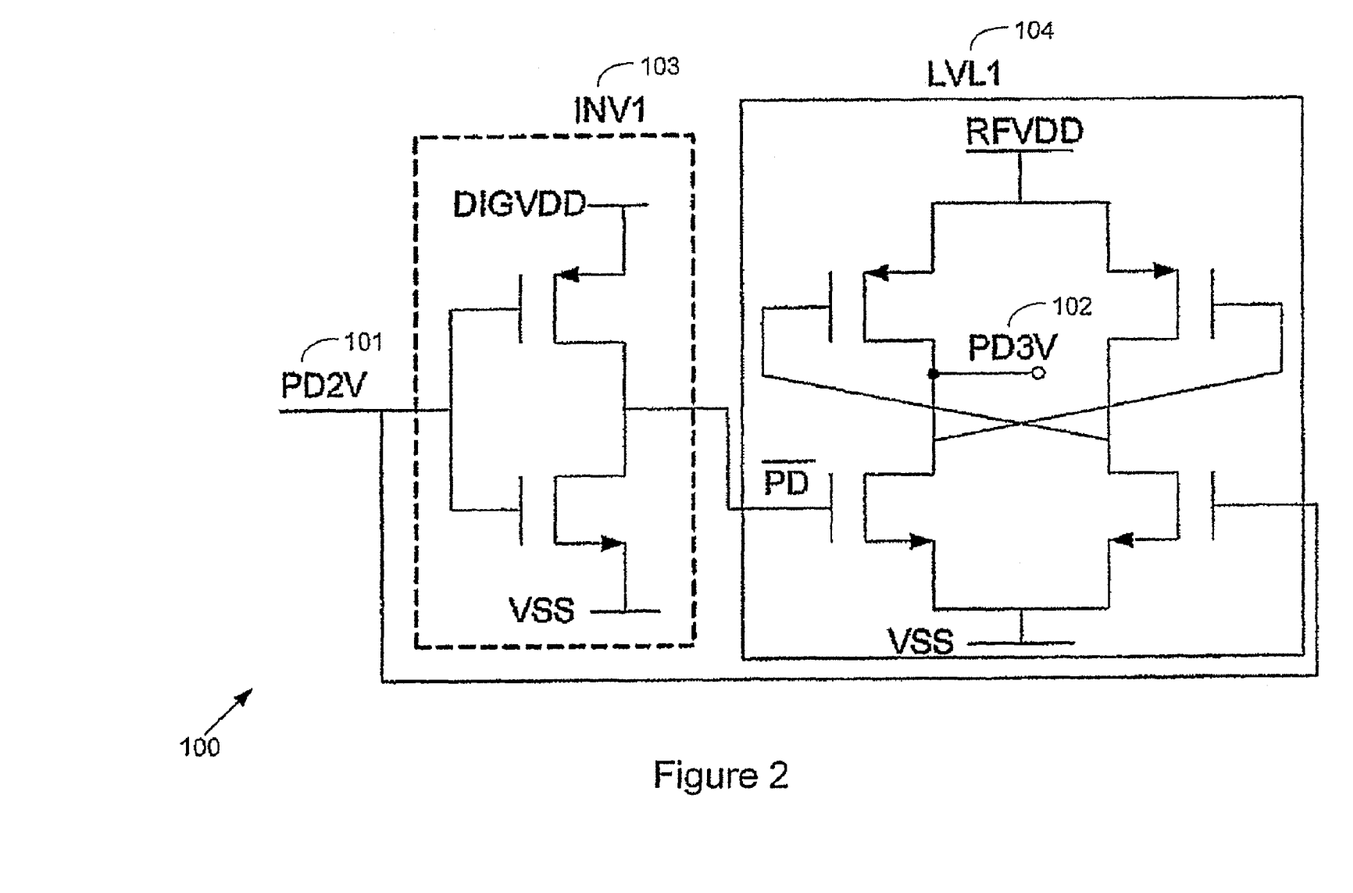
FIG. 2 shows a level shift circuit.

The power down bits within the power down registers 16 are set by an external digital controller 12, which writes the required values into the registers 16 via an appropriate serial interface 19, such as a Serial Peripheral Interface (SPI) or an Inter-Integrated Circuit (I2C). For the various analogue circuits 15 operating directly from RFVDD, a power down signal at a logic level of DIGVDD may not be sufficient to correctly implement the power down function. Hence, level shift circuits 100 are used to convert DIGVDD power down signals to RFVDD. A typical level shift circuit 100 is shown in FIG. 2. In FIG. 2, the digital inverter INVI 103 generates the inverse of the power down signal PD2V 101 which drives the differential level-shifting latch LVL1 104 to generate PD3V 102. The advantage of using a differential level shift circuit such as that shown in FIG. 2, as opposed to a single-ended level shift amplifier, is that the circuit of FIG. 2 consumes zero d.c. bias current while a single-ended level shift typically requires a d.c. bias current. This additional d.c. bias current may be disadvantageous in portable applications which operate from a battery.

If the functionality of the chip 11 is not required, then the external controller 12 sends an appropriate command via the serial interface 19 to set all the digital bits in the power down registers 16 to HIGH. All the circuits on the chip will be powered off, thus saving power and consequently extending the battery life.

At the same time, problems may also occur if the external controller 12 sends a command to power off the on-chip voltage regulator 18 which generates the digital supply voltage, DIGVDD. Firstly, the digital bits in the power down registers 16 will collapse to zero and the power down level shifter 100 will no longer operate correctly (both power down and its inverse in FIG. 2 fall to zero). The 3V logic power down levels are undefined (tri-state) and may go LOW such that the analogue circuits 15 operating from the RFVDD are powered up drawing significant currents. Secondly, since the digital supply voltage is removed, the serial interface 19 will no longer work and it will not be possible to power up the chip 11 again by sending commands via this interface 19.

One possible solution provided by the present invention is to control the power up and down of the regulator 18 from an external pin rather than via the serial interface 19. This may overcome the second problem of not being able to power the chip 11 again, but may also result in the power down register 16 values going LOW again. In addition, in system-on-chip designs, external pins are typically limited and there may not be one pin spare to implement this regulator power down function. If the regulator power down function is not provided, then in standby mode the regulators generating the digital supply voltage will remain on, which will result in wasted power.

SUMMARY OF THE INVENTION

The present invention aims to provide a solution to address the above problems.

In a first aspect of the present invention, there is provided apparatus for controlling an integrated circuit, comprising a power control device for controlling the power to at least part of the integrated circuit, the power control device being connected to a first input, for receiving a power-down signal, and a second input, for receiving a power-up signal, the power control device being adapted to power-up the at least part of the integrated circuit if a power-up signal is received at the second input when the at least part of the integrated circuit is in a powered-down state, and the power control device being further adapted to maintain the at least part of the integrated circuit in the powered-up state regardless of any signal received at the second input when the at least part of the integrated circuit is in a powered-up state, the apparatus being arranged so that the second input is also connected to a component of the integrated circuit and the apparatus comprising means for sending a signal to the component of the integrated circuit via the second input when the at least part of the integrated circuit is in the powered-up state.

Preferably the at least part of the integrated circuit comprises digital control circuitry, and preferably the digital control circuitry comprises a serial interface.

The first input may be connected to the serial interface, and the second input may be connected to an external control line separated from the serial interface.

That feature is particularly important and so in a further independent aspect there is provided apparatus for controlling an integrated circuit, the integrated circuit comprising digital control circuitry, and the digital control circuitry comprising a serial interface, the apparatus comprising a power control device, the power control device being connected to a first input, for receiving a power-down signal, and a second input, for receiving a power-up signal, the power control device being adapted to power-down the digital control circuitry in response to the power-down signal and to power-up the digital control circuitry in response to the power-up signal, wherein the apparatus is arranged so that the power-down signal is sent to the first input via the serial interface and the power-up signal is sent to the second input via an external control line separated from the serial interface.

Preferably the power control device comprises a latch circuit and the first input and the second input are each connected to the latch circuit. The latch circuit may comprise a set-reset latch circuit, in which case the first input may be connected to the set input of the latch circuit and the second input may be connected to the reset input of the latch circuit.

Preferably the power control device is adapted to generate a power-down signal at a second output of the latch circuit in response to receipt of a power-down signal at the first input, and to generate a power-up signal at a first output of the latch circuit in response to receipt of a power-up signal at the second input when the at least part of the integrated circuit is in the powered-down state.

The first output of the latch circuit and the second output of the latch circuit may each be connected to a power regulation circuit for regulating power from a power source, and the power control device may be adapted to control the power to the at least part of the integrated circuit by controlling the power regulation circuit.

The power control device may be included in the integrated circuit.

The at least part of the integrated circuit may comprise digital control circuitry, and the digital control circuitry may be adapted to control the powering down of analogue circuitry included in the integrated circuit.

That feature is particularly important and so in a further independent aspect there is provided apparatus for controlling an integrated circuit, comprising a power source for powering at least analogue circuitry included in the integrated circuit, a power-down circuit for powering down the analogue circuitry, and digital control circuitry adapted to control the powering down of the analogue circuitry by sending a control signal to the power-down circuit, the digital control circuitry also being adapted to power-down, wherein the apparatus further comprises switching means arranged so as to be closed when the digital control circuitry is powered down and when closed to connect the power source to the power down circuit so as to ensure that the analogue circuitry remains in a powered-down state. The switching means may comprise a transistor, for instance a field effect transistor, and in particular may comprises a PMOS device.

Preferably the digital control circuitry is adapted to send the control signal to the power-down circuit via a level shift circuit. In that case, the switching means may be adapted, when closed, to connect the power source to the output of the level shift circuit.

The switching means may be adapted to close in dependence upon an output signal from a power control device.

Preferably the digital control circuitry is adapted to receive an external signal and to power down the analogue circuitry upon receipt of the external signal, and preferably the external signal is received via a serial interface.

The power control device may also be adapted to receive the external signal, and preferably the power control device is adapted to power down the digital control circuitry upon receipt of the external signal.

The switching means may be adapted to open in dependence upon a further output signal from the power control device, and the digital control circuitry may be adapted to power-up in dependence upon the further output signal from the power control device.

Preferably the power control device is adapted to receive a further external signal and to generate the further output signal upon receipt of the further external signal.

The power control device may be connected to an external control line separate from the serial interface and may be adapted to receive the further external signal via the external control line.

The power control device may comprise a latch circuit and preferably the output signal is output from a first output of the latch circuit and the further output signal is output from a second output of the latch circuit.

The apparatus may comprise a delay means, such as delay circuitry, to output a signal only if an input signal is maintained for a pre-determined length of time. Thus, the effect of extraneous signals such as spikes, may be mitigated. The apparatus may be arranged so that the delay means operates on any of the input signals mentioned herein, and in particular on the power-down or power-up signals mentioned herein.

In a further independent aspect there is provided a method of controlling an integrated circuit, comprising providing a power control device for controlling the power to at least part of the integrated circuit, receiving a power-up signal at the power control device via an input and powering-up the at least part of the integrated circuit if the at least part of the integrated circuit is in a powered-down state, and maintaining the at least part of the integrated circuit in the powered-up state regardless of any signal received via the input when the at least part of the integrated circuit is in a powered-up state, the method further comprising sending a signal to a component of the integrated circuit via the input when the at least part of the integrated circuit is in the powered-up state.

There is also provided, in another independent aspect, a method of controlling an integrated circuit, the integrated circuit comprising digital control circuitry, and the digital control circuitry comprising a serial interface, the method comprising powering-down the digital control circuitry in response to a power-down signal and powering-up the digital control circuitry in response to a power-up signal, the method further comprising sending the power-down signal via the serial interface and sending the power-up signal via an external control line separate from the serial interface.

In a further independent aspect there is provided a method of controlling an integrated circuit, the integrated circuit comprising analogue circuitry, a power-down circuit for powering down the analogue circuitry, and digital control circuitry adapted to control the powering down of the analogue circuitry, the method comprising sending a control signal to the power-down circuit via the digital control circuitry to power down the analogue circuitry, powering down the digital control circuitry, and connecting a power source to the power-down circuitry so as to maintain the analogue circuitry in a powered-down state when the digital control circuitry is powered down.

Any feature in one aspect of the invention may be applied to another aspect of the invention, in any appropriate combination. In particular, apparatus features may be applied to method features and vice versa.

BRIEF DESCRIPTION OF DRAWINGS

Embodiments of the presenting invention will be described, purely by way of example, with reference to the accompanying drawings, wherein.

DETAILED DESCRIPTION

An apparatus for processing signals is disclosed. In the following description, a number of specific details are presented in order to provide a thorough understanding of embodiments of the present invention. It will be apparent, however, to a person skilled in the art that these specific details need not be employed to practice the present invention.

Figure 3:
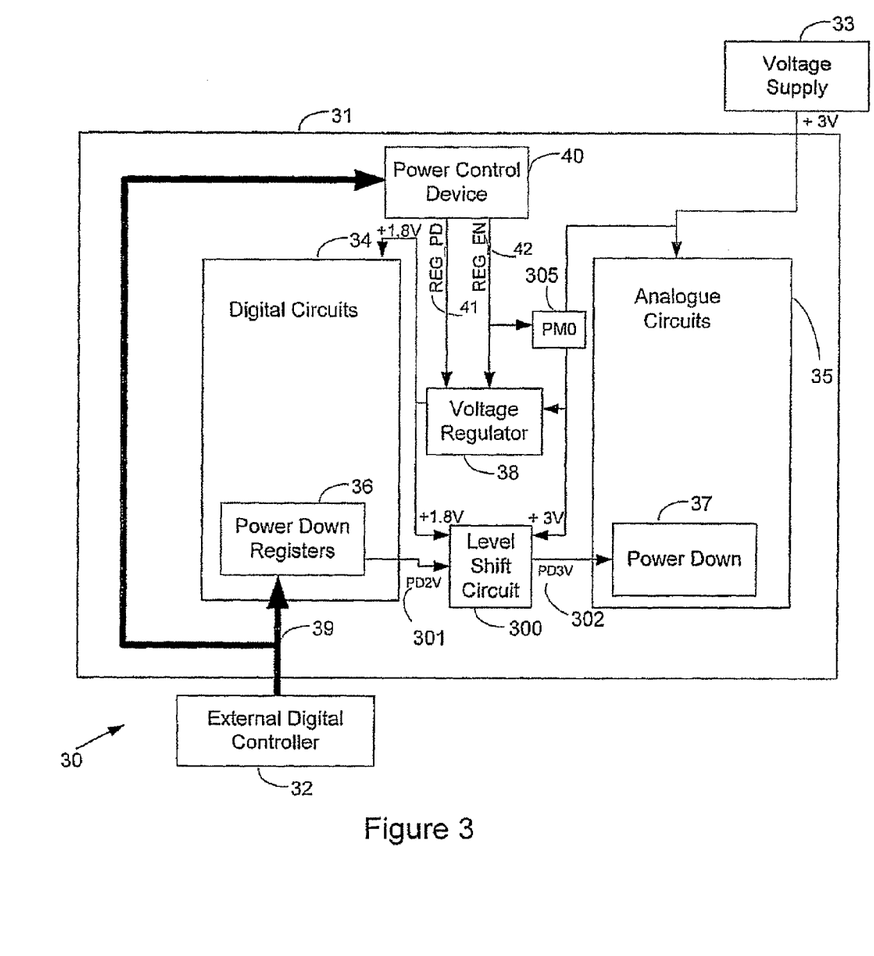
FIG. 3 shows a mixed signal chip including a power control device according to an embodiment of the present invention.

FIG. 3 shows a mixed signal chip 31 comprising a power control device 40 according to an embodiment of the present invention. A feature of the present invention is that an external controller 32 can put the entire chip 31 into a total power-down state. The external controller 32 comprises, in this example, a microcontroller, but could include a digital signal processor (DSP), an application specific integrated circuit (ASIC) device or any other device capable of processing signals and sending commands. In order to power down the mixed signal chip 31 and the on-chip voltage regulator 38, an appropriate command must be sent via a serial interface 39 to the power control device 40. For example referring to FIG. 4, when a digital '1' is written to input killchip 51 of the power control device 40, an appropriate output will be generated at REG_PD 42 which then effectively powers down the regulator 38. Consequently, the chip 31 is put into a powered-down state. The regulator 38 can be powered up again by sending a digital '0' to Resusc_N 52 of the power control device 50.

Figure 4:
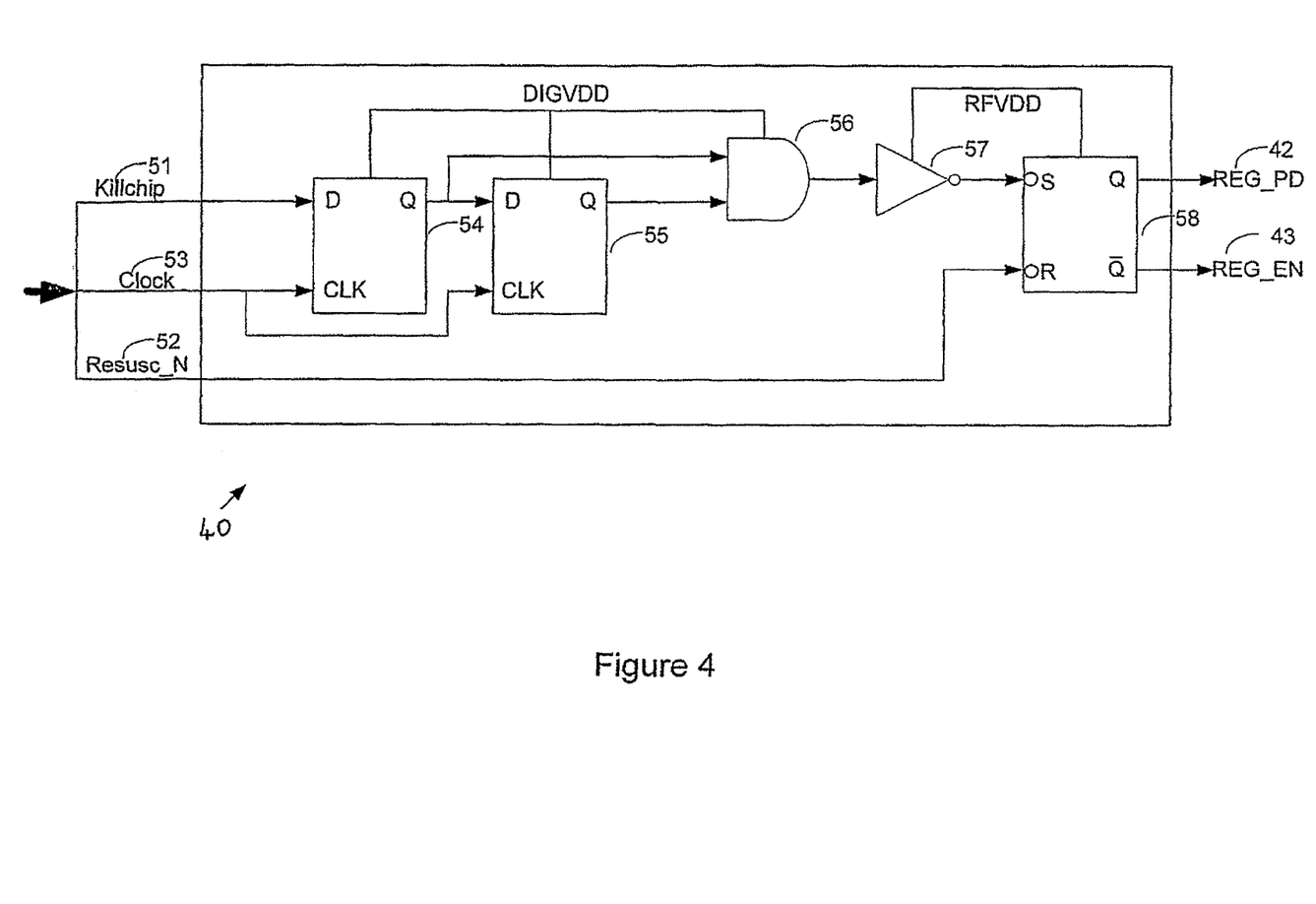
FIG. 4 shows a power control device according to an embodiment of the present invention.

The Resusc_N signal only has an effect on the operation of the power control device when the chip is in a powered-down state. When the chip is in a powered-up state the Resusc_N signal has no effect on the operation of the power control device.

The Resusc_N signal comes from an external pin connected to the external digital controller 32 but separate from the serial interface 39. This external pin has a dual use and is connected to another component of the chip as well as the power control device. When the chip is in a powered-up state the external pin is used to send data to that other component (the signal on the external pin at that time having no effect on the operation of the power control device). In the preferred embodiment, the other component is the power down register 36, but in variants of the preferred embodiment the other component may be any other part of the digital circuit 36 or indeed any other part of the integrated circuit 31, and the external pin may be used to send data to instruct actions or to receive diagnostic information.

The core of the power control device 50 is an SR-latch 58 constructed from 3V logic. Referring to FIG. 4, both Set and Reset inputs are active LOW. The Set input signal is created by inverting the incoming signal using a 2V to 3 V inverting amplifier 57.

Under normal operation the Killchip 51 signal is LOW and thus the Set input is HIGH, i.e. inactive. The Reset signal is derived from the Resusc_N 52 signal. Under normal operation when the chip is first powered up the Resusc_N 52 signal is taken LOW and thus the Reset input is LOW, which clears the SR latch 58 and sets the REG_PD 42 signal LOW (i.e. inactive).

Consider now that the Killchip 51 bit is set HIGH via an appropriate command. This killchip 51 signal is sampled by two D-type flip flops (DFFs) 54, 55 which are clocked by a clock 53 (not shown). The DFFs 54, 55 ensure that no action is taken by the power control device unless Killchip 51 is HIGH for at least two clock cycles, i.e. it ensures that a noise spike on at Killchip 51 will not cause the whole chip to power down.

Assuming that Killchip 51 remains HIGH for two cycles of the clock, then the Set input will go LOW. This sets the Q output of the latch, i.e. REG_PD 42 to 3V. As a result the regulators will power down. All 1.8V digital logic will be set to zero. This means that the Killchip 51 signal itself will fall to zero, and thus the Set input to the latch will be set to RFD, i.e. inactive.

To power up the chip, Resusc_N 52 is held LOW for a suitable period of time. This directly resets the SR latch 58 and sets REG_PD 42 to LOW again.

Figure 5:
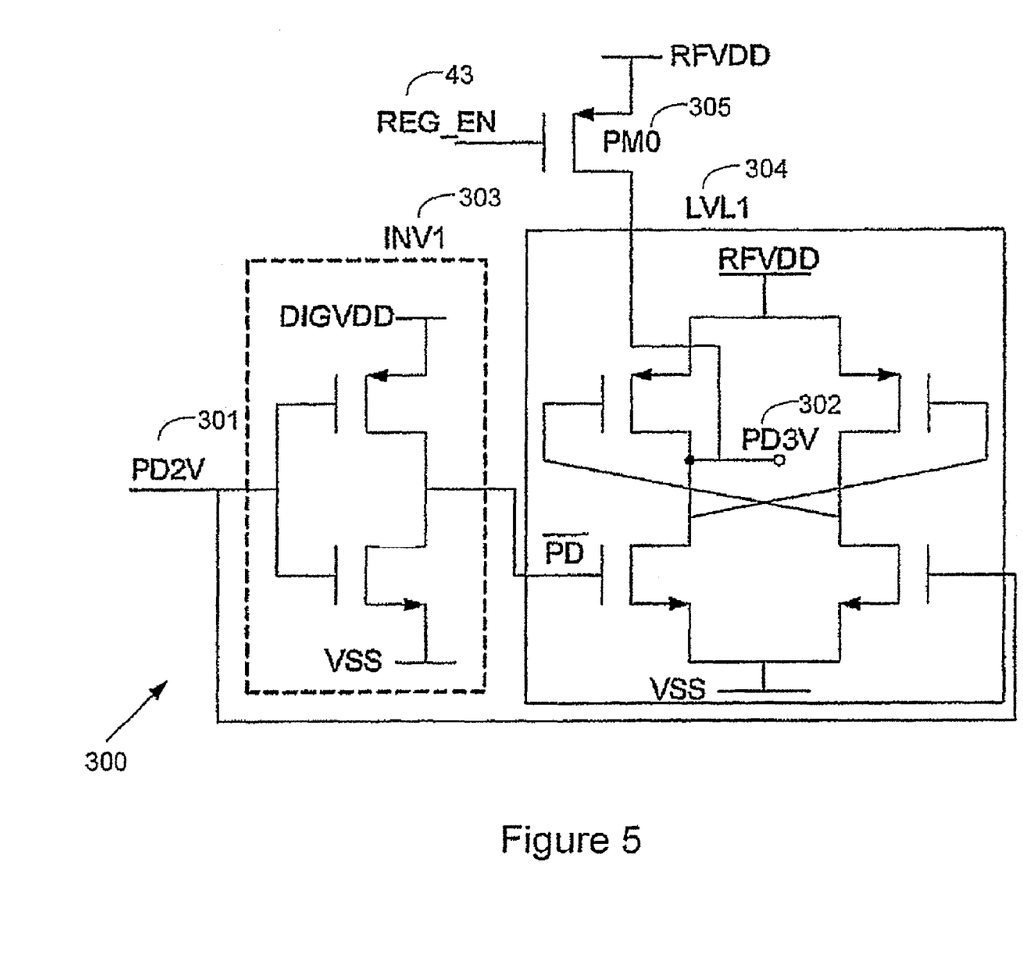
FIG. 5 shows one configuration of a level shift circuit according to an embodiment of the present invention.

The consequence of taking REG_PD 42 HIGH is that DIGVDD collapses to zero and thus all 3V (RFVDD) power down signals are undefined as described above. To stop this situation from occurring, all 3V power down signals have an additional PMOS device PMO 305 with source and drain connected between RFVDD and the PD__3V output as shown in FIG. 5, whose gate is connected to the REG_EN 43 in FIG. 4, as also shown in FIG. 5. When REG_EN 43 is HIGH (normal operation), the PMO 305 is off and the power down signals are controlled by the level shift latches 300 as normal. When REG_EN 43 is LOW, i.e. REG_PD 42 is HIGH and the chip 31 should be completely off the PMOS device PMO 205 is turned on. All power down outputs are pulled to RFVDD, i.e. all power down signals are asserted.

It will be understood that the invention has been described above purely by way of example, and modifications of detail can be made within the scope of the invention.

Each feature disclosed in the description and (where appropriate) the claims and drawings may be provided independently or in any appropriate combination.

What is claimed is:

1. A mixed signal chip comprising a serial interface and a power control device for controlling the power to at least part of an integrated circuit on the chip, wherein said power control device is connected to said serial interface for receiving a power-down signal, and to an external control line separate from the serial interface for receiving a power-up signal, the power control device being adapted to power-up the at least part of the integrated circuit if a power-up signal is received at the external control line when the at least part of the integrated circuit is in a powered-down state, and the power control device being further adapted to maintain the at least part of the integrated circuit in the powered-up state regardless of any signal received at the external control line when the at least part of the integrated circuit is in a powered-up state, the mixed signal chip being arranged so that the external control line is also connected to a component of the integrated circuit with that component being configured to receive data via the external control line when the at least part of the integrated circuit is in the powered-up state.

2. The mixed signal chip according to claim 1, wherein the at least part of the integrated circuit comprises digital control circuitry, and wherein said digital control circuitry comprises a serial interface.

3. The mixed signal chip according to claim 1, wherein the power control device comprises a latch circuit and the serial interface and the external control line are each connected to the latch circuit.

4. The mixed signal chip according to claim 3, wherein the latch circuit comprises a set-reset latch circuit and the serial interface is connected to the set input of the latch circuit and the external control line is connected to the reset input of the latch circuit.

5. The mixed signal chip according to claim 3, wherein the power control device is adapted to generate a power-down signal at a second output of the latch circuit in response to receipt of a power-down signal at the serial interface, and to generate a power-up signal at a first output of the latch circuit in response to receipt of a power-up signal at the external control line when the at least part of the integrated circuit is in the powered-down state.

6. The mixed signal chip according to claim 5, wherein the first output of the latch circuit and the second output of the latch circuit are each connected to a power regulation circuit for regulating power from a power source, and the power control device is adapted to control the power to the at least part of the integrated circuit by controlling the power regulation circuit.

7. The mixed signal chip according to claim 1, wherein the at least part of the integrated circuit comprises digital control circuitry, and the digital control circuitry is adapted to control the powering down of analogue circuitry included in the integrated circuit.

8. The mixed signal chip according to claim 7 and comprising a power source for powering at least analogue circuitry included in the integrated circuit, the digital control circuitry also being adapted to power-down, wherein the mixed signal chip further comprises switching means arranged so as to be closed when the digital control circuitry is powered down and when closed to connect the power source to the power down circuit so as to ensure that the analogue circuitry remains in a powered-down state.

* * * * *